(12) United States Patent
Wu et al.

(10) Patent No.: US 6,180,535 B1
(45) Date of Patent: Jan. 30, 2001

(54) APPROACH TO THE SPACER ETCH PROCESS FOR CMOS IMAGE SENSOR

(75) Inventors: Chuang-Ren Wu, Hsi Chih; Chi-Hsin Lo, Ping-Jang, both of (TW)

(73) Assignee: Taiwan Semiconductors Manufacturing Company, Hsin-Chu (TW)

( * ) Notice: Under 35 U.S.C. 154(b), the term of this patent shall be extended for 0 days.

(21) Appl. No.: 09/389,886

(22) Filed: Sep. 3, 1999

(51) Int. Cl.$^7$ .................................................. H01L 21/00
(52) U.S. Cl. ........................ 438/734; 438/719; 438/723; 438/737; 216/79; 216/99
(58) Field of Search .................... 438/719, 721, 438/723, 724, 734–737, 738, 743, 744, 756, 757; 216/67, 79, 99

(56) References Cited

U.S. PATENT DOCUMENTS

| | | | |
|---|---|---|---|
| 5,385,849 | 1/1995 | Nakashiba | 437/3 |
| 5,811,342 | 9/1998 | Wu | 438/303 |
| 5,837,563 | 11/1998 | Hynecek | 438/60 |
| 5,863,824 | 1/1999 | Gardner et al. | 438/303 |
| 5,899,722 | 5/1999 | Huang | 438/305 |
| 5,945,355 * | 8/1999 | Fritziner et al. | 438/734 |
| 6,046,113 * | 4/2000 | Hong et al. | 438/734 X |
| 6,103,592 * | 8/2000 | Levy et al. | 438/734 X |

* cited by examiner

Primary Examiner—William Powell
(74) Attorney, Agent, or Firm—George O. Saile; Stephen B. Ackerman

(57) ABSTRACT

A new method is provided for the creation of spacers for the CMOS gate electrode. A layer of a spacer material is deposited over the gate structure; a layer of photoresist is deposited over the layer of spacer material. The layer of photoresist of the invention is partially stripped removing the photoresist from above the gate structure and providing a thinner layer of photoresist over the surrounding layer of spacer material. The layer of spacer material is partially etched whereby the layer of photoresist serves as a partial etch stop layer. The remainder of the photoresist is removed, the spacer material is further etched using a dry etch whereby a thin layer of spacer material (oxide) remains deposited over the surface of the substrate. As a final step the thin layer of spacer material (oxide) is removed from the surface of the substrate using a wet etch.

21 Claims, 3 Drawing Sheets

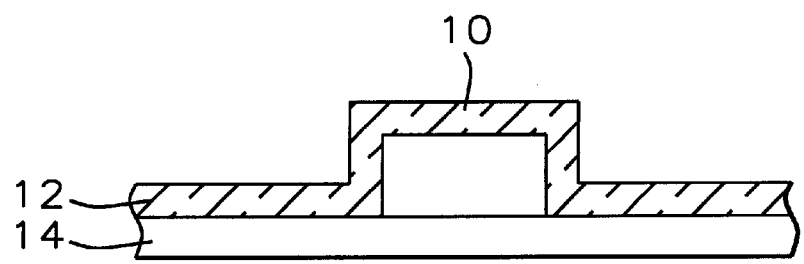
FIG. 1a – Prior Art
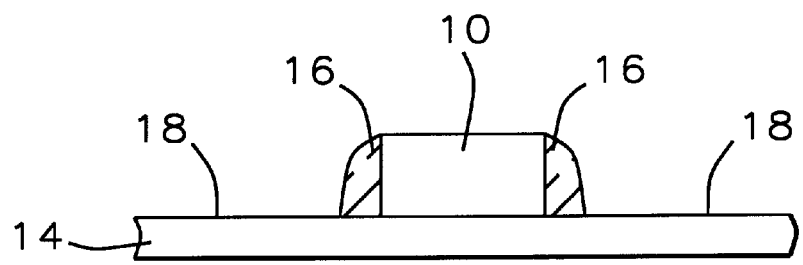
FIG. 1b – Prior Art
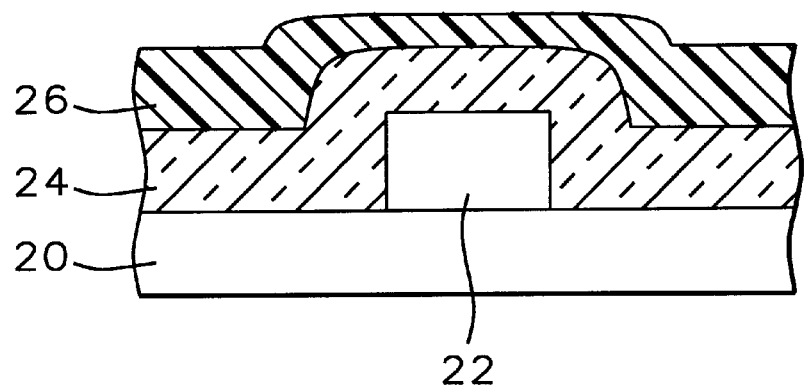
FIG. 2

APPROACH TO THE SPACER ETCH PROCESS FOR CMOS IMAGE SENSOR

BACKGROUND OF THE INVENTION

(1) Field of the Invention

The invention relates to the fabrication of integrated circuit devices and, more particularly, to a method of etching the spacers of the CMOS gate electrode that is used in image sensor devices.

(2) Description of the Prior Art

The manufacturing of semiconductor devices requires the creation of a variety of components that collectively perform functions of data manipulation (logic functions) and of data retention (storage functions). The vast majority of these functions operates in a digital or one-off mode and as such recognize zero and one conditions within the operational levels of the circuits. There are, in addition, applications that make use of analog levels of voltage where the voltage may have a spectrum of values between a high limit and a low limit. There are furthermore applications where both the digital and the analog methods of signal processing reside side by side in the same semiconductor device.

This mixture of functions and processing capabilities brings with it a mixture of components that can coexist within one semiconductor device. Where the vast majority of device components is made up of transistors, gate electrodes and a variety of switching components that address logic processing functions, it is not uncommon to also see resistors and capacitors that form part of a semiconductor device. It is for instance known that capacitors form a basic component of many analog circuits that are used for analog applications such as switched capacitor filters. It is also well known in the art that capacitors are widely applied in digital applications such as the storage node for Dynamic Random Access Memory (DRAM) circuits. This ability of capacitors to function in either the digital or the analog mode is referred to as the mixed mode application of the capacitor.

The DRAM technology is widely used for data storage where one transistor and one capacitor form one DRAM cell. For the capacitor a stacked capacitor is frequently used since this structure has good data storage performance characteristics. To fabricate this device, a modified CMOS process is typically used. One other application in which the CMOS structure has been successfully applied is in the creation of image sensors; it is this latter application that is addressed by the invention.

An image sensor is, in its broadest terms, used to convert an optical image that is focused on the sensor into electrical signals. The image sensor typically includes an array of light detecting elements, where each element produces a signal corresponding to the intensity of light impinging on that element when an image is focused on the array. These signals may then be used, for example, to display a corresponding image on a monitor or may otherwise be used to provide information about the optical image.

One very common type of image sensor is a charge-coupled device (CCD). Integrated circuit chips containing CCD image sensors have a relatively low yield and are expensive due to the specialized processing involved. The CCD's also consume a relatively large amount of power.

A much less expensive type of image sensor can be formed as an integrated circuit by using a CMOS process. In such a CMOS type image sensor, a photodiode or phototransistor (or any other suitable device) is used as the light-detecting element, where the conductivity of the element corresponds to the intensity of light impinging on the element. The variable signal thus generated by the light detecting element is an analog signal whose magnitude is approximately proportional (within a certain range) to the amount of light that impinges on the element.

The light-detecting elements are typically formed in a two-dimensional core array, which is addressable by row and column. Once a row of elements has been addressed, the analog signals from each of the light detecting elements in the row are coupled to the respective columns in the array. An analog-to-digital converter may then be used to convert the analog signals of the columns to digital signals so as to provide only digital signals at the output of the image sensor chip.

What is needed is an inexpensive, but highly efficient, image sensor, which produces reliable images. Implied in this is that leakage current in the spacer regions, that is the source/drain regions of the CMOS gate electrode of the image sensor, is reduced to a minimum. Potential plasma damage that can be caused during the spacer etching must therefore be kept at a minimum.

FIG. 1 shows a Prior Art gate electrode with the etching of the spacer, as follows:

FIG. 1a shows the poly silicon gate electrode 10, a layer 12 of tetra-ethyl-ortho-silicate (TEOS) has been deposited over the gate electrode 10 and the top surface of substrate 14. FIG. 1a shows that only one layer of the dielectric TEOS is deposited in order to form the gate electrode spacers.

FIG. 1b shows the results of the spacer etch, gate electrode spacers 16 are formed after etching has been completed. It is apparent from FIG. 1b that lack in control of the etching or over-etching can readily cause damage the surface areas 18 of substrate 14.

Using current fabrication technology, it is well known that defects in the substrate cause leakage current between the gate electrodes of the image sensor, especially where the substrate defects are caused by plasma damage. It is therefore of key importance to produce a substrate surface that is free of damage and, more particularly, to be able to perform spacer etching without causing damage to the substrate surface. Current practice uses a single layer of dielectric above the spacer between the gate electrodes of the image sensor. With only a single layer of dielectric, it is difficult to sense and control the etch stop above the substrate. This difficulty in controlling the etching process results in substrate surface damage; this in turn results in leakage current between the gate electrodes of the CMOS image sensor device.

An additional problem is that, during the growth of field oxide, a phenomenon occurs that causes defects when the gate oxide is grown. This problem is referred to as white ribbon or white pixels. A thin layer of silicon nitride can form on the silicon surface (i.e., the pad-oxide/silicon surface interface) as a result of the reaction of $NH_3$ and silicon at that interface. When the gate oxide is grown, the growth rate becomes impeded at the locations where the silicon nitride has been formed. The gate oxide is thus thinner at these locations than elsewhere, causing low-voltage breakdown of the gate oxide.

The invention teaches a new method of etching the spacers for gate electrode structures. Typical silicon oxide gate spacers are formed via anisotropic RIE of a deposited layer of silicon oxide layer, using $CHF_3$ or $CF_4$—$O_2$—He as an etchant. Typical silicon nitride spacers are formed via anisotropic RIE of a deposited layer of silicon nitride layer, using $CHF_3$ or $SF_6$—$O_2$ as an etchant. Typical gate spacers can also be formed using thermal $S_iN$ or using CVD $S_iN$ or using thermal $SiO_xN_y$ or using CVD $SiO_xN_y$ to a thickness within the range between 250 and 1500 Angstrom. The invention provides a new sequence of steps for the formation of gate spacers.

The invention addresses the above-indicated problems of white pixel formation while at the same time providing a good method for endpoint detection during the etching of the gate spacers. The invention further prevents the occurrence of plasma damage to the surface of the substrate thereby reducing leakage current along the surface of the substrate.

U.S. Pat. No. 5,899,722 (Huang) discloses a process using a double spacer.

U.S. Pat. No. 5,863,824 (Gardner) shows a two step spacer process that protects the substrate surface during the etch.

U.S. Pat. No. 5,811,342 (Wu) shows a sloping spacer 22 process for a graded LDD. However, this reference differs from the invention.

U.S. Pat. No. 5,837,563 (Hynecek) and U.S. Pat. No. 5,385,849 (Nakashiba) show CMOS Tx image sensor processes.

SUMMARY OF THE INVENTION

A principle objective of the invention is to reduce the formation of white pixels during the process of creating gate spacers for a CMOS gate electrode.

Another objective of the invention is to provide a good method of end-point detection for the etching of gate spacers for a CMOS gate electrode.

Yet another objective of the invention is to prevent plasma damage to the surface of the substrate during the etching of gate spacers for a CMOS gate electrode.

In accordance with the objectives of the invention a new method is provided for the creation of spacers for the CMOS gate electrode. A layer of a spacer material is deposited over the gate structure; a layer of photoresist is deposited over the layer of spacer material. The layer of photoresist of the invention is partially stripped removing the photoresist from above the gate structure and providing a thinner layer of photoresist over the surrounding layer of spacer material. The layer of spacer material is partially etched whereby the layer of photoresist serves as a partial etch stop layer. The remainder of the photoresist is removed, the spacer material is further etched using a dry etch whereby a thin layer of spacer material (oxide) remains deposited over the surface of the substrate. As a final step the thin layer of spacer material (oxide) is removed from the surface of the substrate using a wet etch.

BRIEF DESCRIPTION OF THE DRAWINGS

FIG. 1 shows a cross section of a Prior Art gate electrode, as follows:

FIG. 1a shows a cross section of a Prior Art gate electrode with a layer of gate material deposited over the gate structure.

FIG. 1b shows a cross section of a gate electrode after the gate spacers have been formed.

FIGS. 2 through 7 show the process of the invention, as follows:

FIG. 2 shows a cross section of a gate structure over which a layer of spacer material and a layer of photoresist have been deposited.

FIG. 3 shows a cross section of a gate electrode after the layer of photoresist has been partially stripped.

FIG. 4 shows a cross section of a gate electrode after the layer of spacer material has been partially etched.

FIG. 5 shows a cross section of a gate electrode after the layer of photoresist has been removed.

FIG. 6 shows a cross section of a gate electrode after the layer of spacer material has been partially etched back.

FIG. 7 shows a cross section after the remainder of the spacer material has been removed from the surface of the substrate.

DESCRIPTION OF THE PREFERRED EMBODIMENTS

Figure 3:
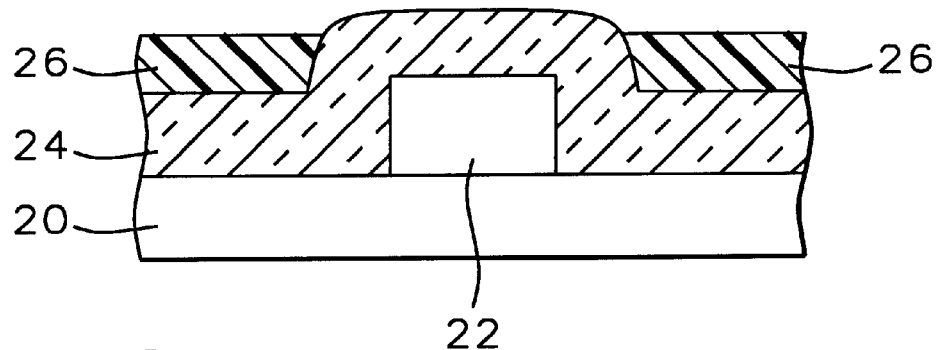

Referring now specifically to FIG. 2, there is shown a cross section of a gate electrode 22 formed on the surface of a substrate 20. A layer 24 of spacer material has been deposited over the gate structure 22 and over the exposed surface of the substrate 20. Over the layer 24 of spacer material in turn has been deposited a layer 26 of photoresist.

A number of materials can be used for the gate dielectric such as oxides (RTO oxide, JVD oxide), nitrides (RTP $S_iN$, RTP $SiO_xN_y$) and polysilicon. The preferred material for the gate electrode of the invention is polysilicon.

The gate electrode 22 is typically created by first depositing an in-situ doped polysilicon layer using LPCVD processing at a temperature between about 550 and 850 degrees C. to a thickness between about 2000 and 4000 Angstrom using $SiH_4$ and $PH_3$. The polysilicon structure is created by standard photolithographic masking techniques followed by RIE processing which uses HBr and $Cl_2$ etch ambient to define the desired pattern in the layer of polysilicon.

A variety of materials can be used in the formation of spacers for a gate electrode structure. Gate spacer materials that are known in the art can contain silicon nitride, silicon oxide, BSG, PSG, polysilicon and other materials preferably of a dielectric nature, CVD oxide formed from a TEOS source. Often amorphous materials are used that inhibit the deposition of epitaxial silicon thereupon.

The preferred spacer material to be used for the process of the invention is TEOS. The layer 24 of spacer material can be formed by thermal deposition or by using CVD techniques and is typically deposited to a thickness between about 700 and 3000 Angstrom.

The layer 26 of photoresist can be formed using thermal deposition (spin-coating and baking) or by using CVD techniques and is typically deposited to a thickness between about 250 and 1000 Angstrom.

It must be emphasized that, as a result of the deposition of the layer 26 of photoresist as shown in FIG. 2, a thinner layer of photoresist 26 is deposited over that surface of the layer 24 of spacer material that is above the structure 22 of the gate electrode.

FIG. 3 shows a cross section of the gate electrode 22 after the layer 26 of photoresist has been partially stripped and thereby significantly reduced in thickness. The photoresist layer 26 can be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

FIG. 3 shows that the layer of photoresist is essentially removed from above the poly gate structure 22 while that layer 26 of photoresist that overlays the gate material 24 has been reduced in thickness to between about 400 and 800 Angstrom.

The purpose of the remaining layer 26 of photoresist is to function as a partial etch stop layer during the subsequent etch of the layer 24 of spacer material. This will become apparent during the following discussion.

Figure 4:
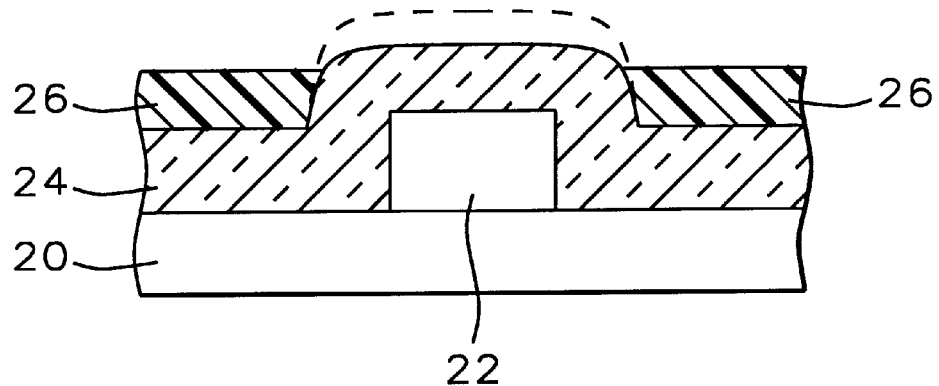

FIG. 4 shows a cross section after a dry etch has been applied to the exposed surface of the spacer material 24 thereby reducing the spacer material that is overlying the gate structure to a thickness between about 250 and 1000 Angstrom, the preferred thickness of this layer is 400 Angstrom. The process of dry etching can be performed in a chlorine-based plasma or a sequence of chlorine-based and fluorine based dry etches. Typically, one or more halogenated compounds are used as an etchant gas. For example $CF_4$, $CHF_3$ (freon 23), $SF_6$, $NF_3$, can be used. Added can be gases such as $O_2$, Ar, $N_2$. The etch can be performed in an etcher such as a parallel plate RIE apparatus or an electron cyclotron resonance (ECR) plasma reactor.

The preferred etching conditions for the TEOS etch are as follows: etchant gas: $CF_4$ or $CHF_3$ at a flow rate of about 15 sccm, gas pressure about 800 mTorr, rf power density about 400 Watts, no magnetic field applied, wafer temperature about −17 degrees C. (which is the chuck temperature), time of the etch about 10 seconds.

Figure 5:
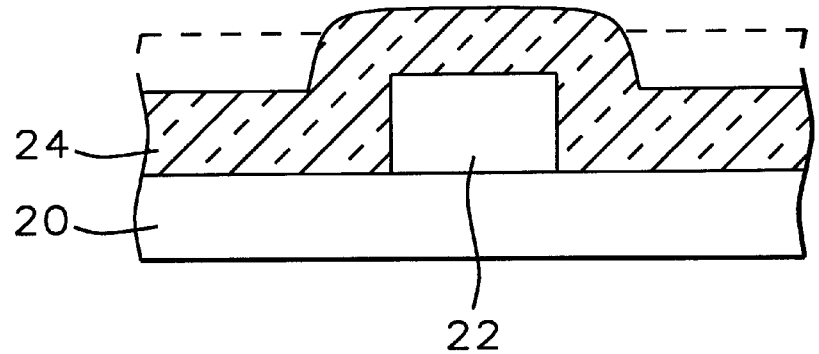

FIG. 5 shows a cross section after the layer of photoresist has been removed from above the surface of the substrate thereby leaving the layer 24 of spacer material essentially in place. The methods that can be used for the process of removing the photoresist have already been highlighted above under FIG. 3; these same methods can be applied for the removal of the layer of photoresist that has been indicated in FIG. 5.

Figure 6:
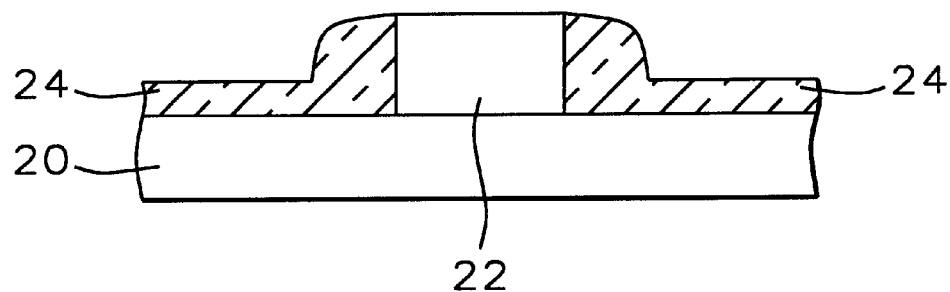

FIG. 6 shows a partial removal of the layer 24 of spacer material. The partial removal of the layer 24 can be achieved by an anisotropic dry etch using $Ar/CF_4$ as an etchant at a temperature of between about 120 and 160 degrees C. and a pressure of between about 0.30 and 0.40 Torr for a time of between about 33 and 39 seconds. The partial removal of the layer 24 of gate material has completely removed the gate material 24 from above the structure 22 of the gate electrode while the thickness of the gate material that overlies the surface of the substrate 10 has been reduced to a thickness of between about 200 and 400 Angstrom. This thinner layer of TEOS oxide remains in place above the regions of the source and drain areas of the gate structure, that is essentially the surface of the substrate 10 that surrounds the gate structure 22. This latter point is of importance since this layer of TEOS oxide which overlies the surface of the substrate 10 serves to protect the surface of the substrate 10 during the final etch of the spacer material.

Figure 7:
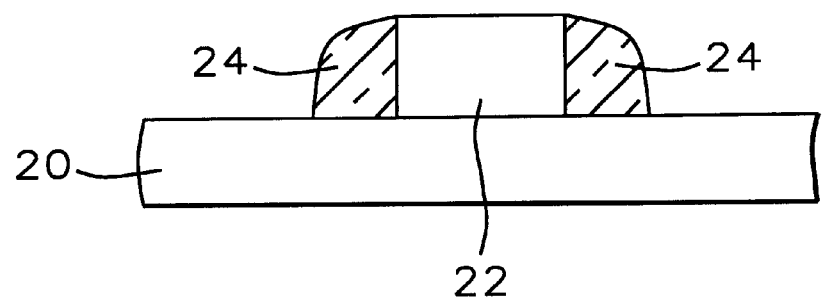

FIG. 7 shows a cross section of the gate structure after the completion of the final etch of the spacers of the gate structure. During this etch, the layer of TEOS oxide that was left on the surface of the substrate has been removed. It must also be noted that the spacers 24 on the side of the gate structure 22 have been considerably reduced as part of this etch. The processing steps to remove the spacer material as reflected in FIG. 7 is a wet dip process using a HF solution. A HF wet dip is a one time process performed at atmospheric pressure using a conventional wet bench process with a gas source of $H_2O:HF=100:1$ for a duration of about 2 minutes.

The processing sequence of the invention can be summarized as follows:

FIG. 2, a gate electrode structure is formed

FIG. 2, a layer of spacer material is,deposited over the gate electrode and the surrounding surface of the substrate FIG. 2, a thin layer of photoresist is deposited over the layer of spacer material. Prior Art does not use this layer of photoresist, the layer of photoresist serves the purpose of a partial stop layer during the spacer etch FIG. 3, partially strip the layer of photoresist removing the photoresist from above the gate electrode structure but leaving photoresist in place adjacent to the gate electrode so that this photoresist can serve as a partial stop layer when forming the gate spacers FIG. 4, partially etch the layer of spacer material that is overlying the gate electrode structure reducing the thickness of the layer of spacer material that is overlying the gate structure to preferably about 400 Angstrom thick. During this process of partially etching the spacer material, the layer of photoresist has served as stop layer thereby leaving the layer of spacer material essentially in place in the areas surrounding the gate structure while essentially removing the spacer material where the photoresist is not present, that is from above the gate structure FIG. 5, removing the remainder of the photoresist since the function of partial stop layer for the etch of the spacer material has been performed FIG. 6, perform a dry etch of the layer of spacer material leaving a thinner layer of spacer material overlying the source/drain regions of the gate structure FIG. 7, perform the final etch for the gate spacers with a wet etch using a HF solution.

Essential in the above indicated processing sequence is the deposition of the layer of photoresist, the partial stripping of the photoresist and the function that the photoresist plays of stop layer during the etch of the spacer material thereby enabling a partial etch of the spacer material. This sets the stage for etching of the spacer material using a two step sequence, a dry etch followed by a wet etch. The dry etch leaves a layer of oxide over the surface of the substrate which acts as a protective layer. The final wet etch does therefore not result in the typical plasma damage to the surface of the substrate. As an added benefit, the two step etch of the spacer material (a partial etch followed by a final etch) extends the overall processing time (enlarges the processing window) which makes it easier to detect the end point for the etch of the spacer material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a semiconductor device, comprising the steps of:

providing a semiconductor substrate;

forming a gate electrode on the surface of said substrate;

depositing a layer of spacer material over the surface of said gate electrode thereby including the exposed surface of said substrate;

depositing a layer of photoresist over the surface of said spacer material;

partially removing said layer of photoresist thereby leaving a remainder of photoresist in place;

partially removing said layer of spacer material;

removing said remainder of said layer of photoresist;
performing a dry etch of said layer of spacer material; and
performing a wet etch of said layer of spacer material.

2. The method of claim 1 wherein said forming a gate electrode on the surface of said substrate is forming a polycide gate electrode, comprising the steps of:
   depositing over the surface of said substrate an in-situ doped polycide layer using LPCVD processing at a temperature between about 550 and 850 degrees C. to a thickness between about 2000 and 4000 Angstrom using $SiH_4$ and $PH_3$; and
   applying masking techniques followed by RIE processing which uses HBr and $Cl_2$ etch ambient to define the desired pattern of said layer of polycide.

3. The method of claim 1 wherein said depositing a layer of spacer material is depositing a layer of TEOS.

4. The method of claim 1 wherein said partially removing said layer of photoresist is removing said photoresist from essentially above that surface of said layer of spacer material that overlies said gate structure thereby substantially leaving said photoresist in place in the areas surrounding said gate structure with a thickness in these areas of between about 400 and 800 Angstrom.

5. The method of claim 1 wherein said partially removing said layer of spacer material is reducing the thickness of said spacer material that essentially overlays said gate structure by a measurable amount whereby the thickness of the layer of spacer material that remains in place and is overlying said gate structure is between about 350 and 450 Angstrom whereby furthermore the remainder of said layer of photoresist serves as an etch stop thereby leaving the layer of spacer material that surrounds said gate structure essentially in place.

6. The method of claim 1 wherein said performing a dry etch of said layer of spacer material is essentially reducing the thickness of said layer of spacer material to where no spacer material remains in place on the surface of said gate structure whereby furthermore the spacer material that is present in the regions of the gate spacers is reduced by a significant amount whereby furthermore a measurable thickness of spacer material remains in place overlying the surface of said substrate in the area adjacent to said gate electrode structure said remaining spacer material having a preferred thickness of between about 350 and 450 Angstrom.

7. The method of claim 1 wherein said performing a wet etch of said layer of spacer material is removing said spacer material from above the substrate surface surrounding said gate electrode structure thereby furthermore reducing the thickness of the gate spacers to their final size.

8. The method of claim 1 wherein the semiconductor device is a CMOS device and the method further comprises forming an NMOS device and a PMOS device.

9. The method of claim 1 wherein said spacer material is selected from the group comprising silicon nitride, silicon oxide, BSG, PSG, polysilicon and other materials preferably of a dielectric nature, CVD oxide formed from a TEOS source or amorphous materials.

10. The method of claim 1 wherein said depositing a layer of spacer material is a thermal deposition or uses CVD techniques whereby said layer of spacer material is deposited to a thickness between about 700 and 3000 Angstrom.

11. The method of claim 1 wherein said depositing a layer of photoresist is using thermal spin-coating and baking deposition or is using CVD techniques and is typically deposited to a thickness between about 250 and 1000 Angstrom.

12. The method of claim 1 wherein said gate electrode comprises a gate oxide region formed on said substrate and a polysilicon region formed on said gate oxide region.

13. The method of claim 1 wherein said gate electrode comprise a polysilicon region formed on said substrate and a silicon oxide region formed on said polysilicon region.

14. The method of claim 1 wherein said gate electrode comprises a gate oxide region formed on said substrate and a polysilicon region formed on said gate oxide region and a salicided contact region formed on said polysilicon region.

15. The method of claim 1 wherein said gate electrode comprises a gate oxide region formed on said substrate and a polysilicon region formed on said gate oxide region and a anti-reflective coating region and a salicided contact region formed on said polysilicon region.

16. A method of forming a semiconductor device, comprising the steps of:
   providing a semiconductor substrate;
   forming a gate electrode on the surface of said substrate said gate electrode to contain polycide;
   depositing a layer of TEOS to a thickness between about 700 and 3000 Angstrom over the surface of said gate electrode thereby including the exposed surface of said substrate;
   depositing a layer of photoresist to a thickness between about 250 and 1000 Angstrom over the surface of said layer of TEOS;
   partially removing said layer of photoresist thereby removing said photoresist from essentially above that surface of said layer of spacer material that overlies said gate structure thereby substantially leaving said photoresist in place in the areas surrounding said gate structure with thickness in these areas of between about 400 and 800 Angstrom thereby creating a remainder of said layer of photoresist;
   partially removing said layer of spacer material thereby reducing the thickness of said spacer material that overlays said gate structure by a measurable amount whereby the thickness of the layer of spacer material that remains in place and is overlying said gate structure is between about 350 and 450 Angstrom whereby furthermore the remainder of said layer of photoresist serves as an etch stop thereby leaving the layer of spacer material that surrounds said gate structure essentially in place;
   removing said remainder of said layer of photoresist;
   performing a dry etch of said layer of spacer material thereby essentially reducing the thickness of said layer of spacer material to where no spacer material remains in place on the surface of said gate structure whereby furthermore the spacer material that is present in the regions of the gate spacers is reduced by a significant amount whereby furthermore a measurable thickness of spacer material remains in place overlying the surface of said substrate in the area adjacent to said gate electrode structure said remaining spacer material having a preferred thickness of between about 350 and 450 Angstrom; and
   performing a wet etch of said layer of spacer material thereby removing said spacer material from above the substrate surface surrounding said gate electrode structure thereby furthermore reducing the thickness of the gate spacers to their final size.

17. The method of claim 16 wherein the semiconductor device is a CMOS device and the method further comprises forming an NMOS device and a PMOS device.

18. The method of claim 16 wherein said gate electrode comprises a gate oxide region formed on said substrate and a polysilicon region formed on said gate oxide region.

19. The method of claim 16 wherein said gate electrode comprise a polysilicon region formed on said substrate and a silicon oxide region formed on said polysilicon region.

20. The method of claim 16 wherein said gate electrode comprises a gate oxide region formed on said substrate and a polysilicon region formed on said gate oxide region and a salicided contact region formed on said polysilicon region.

21. The method of claim 16 wherein said gate electrode comprises a gate oxide region formed on said substrate and a polysilicon region formed on said gate oxide region and a anti-reflective coating region and a salicided contact region formed on said polysilicon region.

* * * * *